(12) United States Patent
Maltabes et al.

(10) Patent No.: US 6,313,567 B1
(45) Date of Patent: Nov. 6, 2001

(54) LITHOGRAPHY CHUCK HAVING PIEZOELECTRIC ELEMENTS, AND METHOD

(75) Inventors: John Maltabes; Alain Charles; Karl Mautz, all of Dresden (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,203

(22) Filed: Apr. 10, 2000

(51) Int. Cl.[7] ................................................... H01L 41/08
(52) U.S. Cl. ........................ 310/328; 73/597; 702/39
(58) Field of Search ............................ 310/316.01, 328; 73/507

(56) References Cited

U.S. PATENT DOCUMENTS

| | | | |
|---|---|---|---|
| Re. 31,053 | 10/1982 | Firtion | 355/77 |
| 4,506,184 * | 3/1985 | Siddall | 310/328 |
| 4,516,254 * | 5/1985 | Hameyama et al. | 378/34 |
| 4,666,291 * | 5/1987 | Tamiguchi et al. | 355/52 |
| 5,197,089 | 3/1993 | Baker | 378/34 |
| 5,863,340 | 1/1999 | Flanigan | 118/728 |
| 5,868,896 | 2/1999 | Robinson | 156/344 |
| 5,904,800 | 5/1999 | Mautz | 156/345 |
| 5,978,078 | 11/1999 | Salamati-Saradh | 356/237 |
| 5,982,166 | 11/1999 | Mautz | 324/158.1 |
| 5,996,415 * | 12/1999 | Stanke et al. | 73/507 |
| 6,182,510 * | 2/2001 | Steinhe et al. | 73/597 |

* cited by examiner

*Primary Examiner*—Mark O. Budd

(57) ABSTRACT

A lithography chuck (100) holds a flat object (150), such as a semiconductor wafer (150) at the backside (152). The chuck has, supported on a base plate (105), a plurality of pins (110-n) to receive partial forces ($F_n$) from the backside (152) and a plurality of piezoelectric elements (120-n) attached to the pins to sense the partial forces ($F_n$) applied from the object (150) to the pins (110-n). The piezoelectric elements (120-n) apply partial displacements ($B_n$) of the pins (110-n) to act on selected areas of the object (150) and thereby compensate for irregularities in the backside contour.

23 Claims, 3 Drawing Sheets

LITHOGRAPHY CHUCK HAVING PIEZOELECTRIC ELEMENTS, AND METHOD

FIELD OF THE INVENTION

The present invention generally relates to processing semiconductor wafers being an intermediate product in the fabrication of integrated circuits (ICs), and, more particularly, relates to an apparatus and to a method used for holding the wafers for lithography processes.

BACKGROUND OF THE INVENTION

In semiconductor arts, structures are obtained on semiconductor wafers or substrates to form a variety of electronic components on the wafer, such as transistors. The wafers are processed, for example, by well-known lithography and etching steps in chambers. The wafer is usually supported by a chuck. Such a process chamber with chuck is illustrated, for example, in U.S. Pat. No. 5,904,800 to Mautz titled "Semiconductor wafer processing chamber . . . ". Two types of lithography chucks currently exist: pin chucks (also referred to as "bed-of-nails") and ring chucks.

U.S. Pat. No. 5,197,089 to Baker titled "Pin chuck for lithography system" illustrates a wafer chuck that supports the wafer by a plurality of closely spaced extensions, each having a top that is on the same plane as the top of the other extensions. The space between the extensions is evacuated (vacuum) and the pressure difference holds the wafer in place.

U.S. Pat. No. 4,506,184 to Sidall titled "Deformable chuck driven by piezoelectric means" illustrates a deformable vacuum pin chuck having a thin silicon chuck for supporting a semiconductor wafer during lithographic processing and a number of piezoelectric transducers for selectively deforming the chuck.

However, lithography chucks are susceptible to wafer backside contamination that causes pattern replication errors or other unwanted non-flatness effects that could cause undesirable rework. The present invention seeks to provide an improved chuck as well as a method that mitigate or avoid disadvantages and limitations of the prior art.

DETAILED DESCRIPTION OF A PREFERRED EMBODIMENT

The present invention provides an improved lithography chuck that is especially useful for holding large wafers, such as having a diameter D of, for example, 300 millimeter.

Figure 1A:
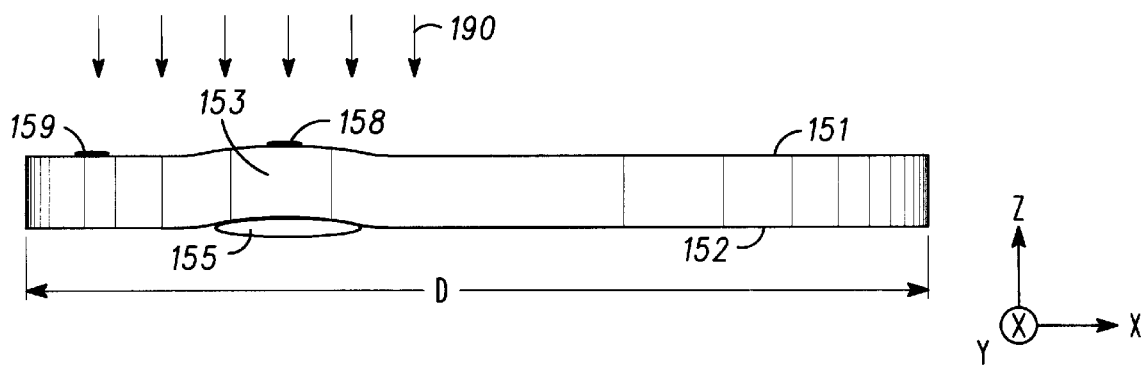
FIG. 1 illustrates simplified side-view and top-view diagrams of a semiconductor substrate having a backside defect.
Figure 1B:
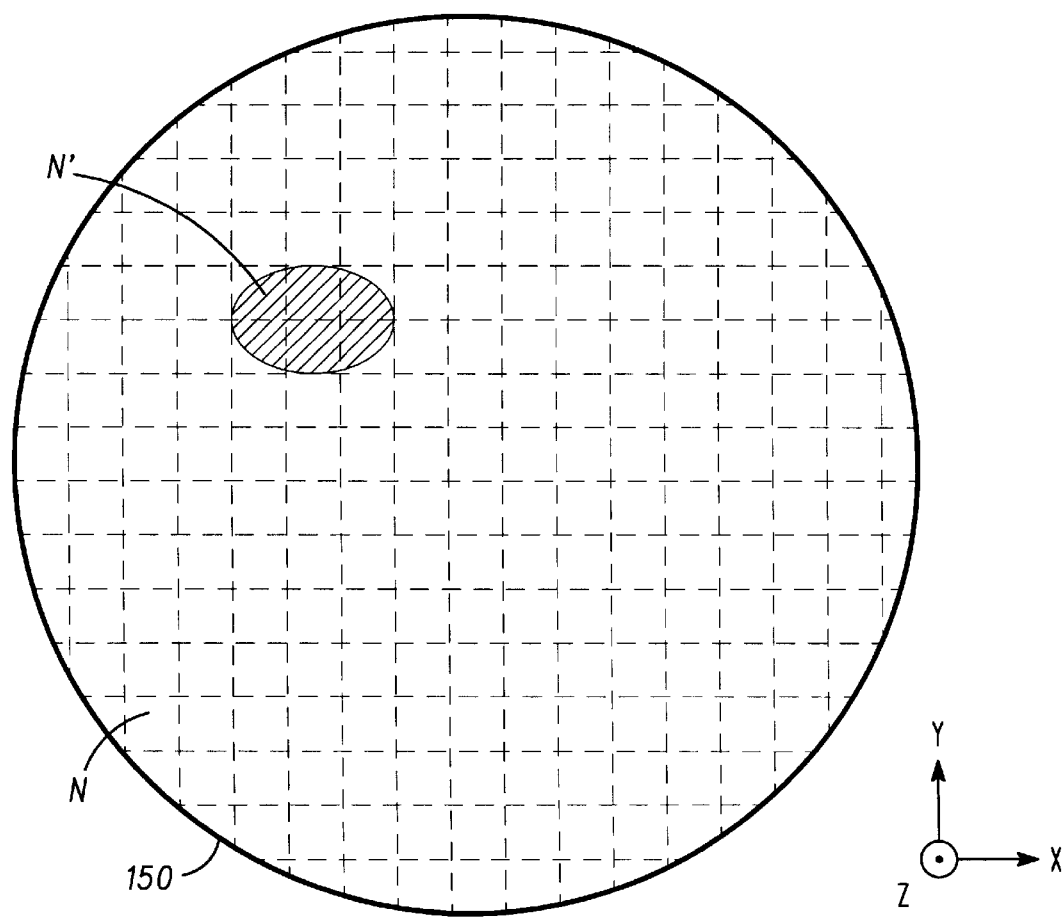

FIG. 1 illustrates simplified side-view and top-view diagrams of flat object 150 having frontside surface 151 and backside surface 152. Object 150 is, preferably a semiconductor wafer, but can also be a flat panel display or other electronic component to be processed. Object 150 is hereinafter referred to as "wafer". For convenience of explanation, FIG. 1 introduces rectangular coordinate system XYZ with the X-axis going right, the Y-axis going into the page, and the Z-axis going up. Coordinate system XYZ illustrates the extension of wafer 150. For an ideal wafer, the Z-coordinate of the backside would be equal across the wafer (e.g., Z=0 at backside 152).

Backside defect 155 stands here for any irregularity on backside 152. Defect 155 causes a backside contour where some Z-coordinates have a positive or negative offset from zero; and defect 155 might elevate portion 153 of wafer 150 into Z-direction. When wafer 150 is exposed to optical beam 190 with equal patterns (e.g., for two circuits to be structured) falling to portion 153, then image 158 (hence the structure created above portion 153 later) might be differently focused as image 159 projected to the non-elevated rest of wafer 150. This is not desired. Further problems could occur when alignment marks are located on or near portion 153.

Defects 155 on the backside can be, for example, (a) photoresist or other evaporated solvent residue from a previous coating step; (b) particles (e.g., silicon dust and film particles); (c) irregularities such as, for example, backside film thickness variations; (d) clip marks, boat marks, or clamp marks.

The top view of wafer 150 illustrates dashed grid lines that—for convenience of explanation only—divide wafer into N areas each having, preferably, the same dimensions. A number of N' areas that are illustrated hashed is elevated due to defect 155 (N'<N).

Usually, the edge of wafer 150 is sealed to the chuck to prevent air leakage. However, a warped wafer or contamination could disturb this so that chuck vacuum errors could occur.

It is further desirable to minimize the contact that the chuck has on wafer backside 152 ("contact percentage") to minimize the impact of defect 155 (backside particles) and prevent contamination from being transferred to the chuck. However, sufficient contact is required to maintain vacuum sealing of the wafer. If backside 152 would be contaminated than the chuck might not operate correctly.

Figure 2:
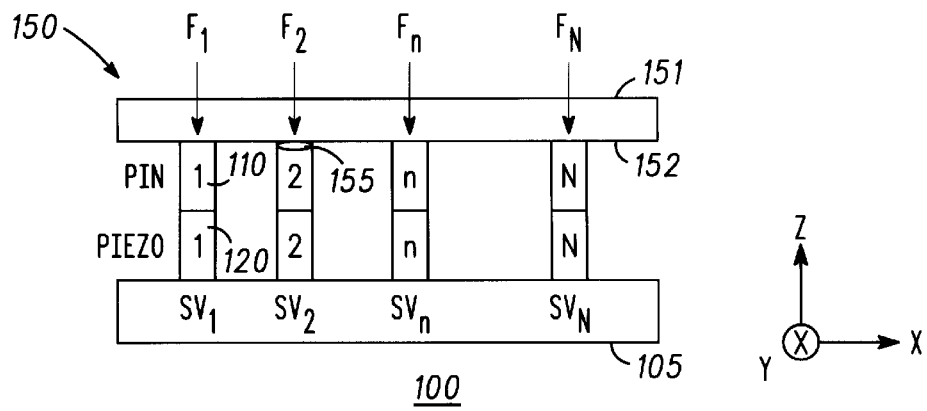
FIG. 2 illustrates a simplified diagram of a chuck according to the present invention.

FIG. 2 illustrates a simplified diagram of lithography chuck 100 to hold wafer 150 at backside 152 according to the present invention. Chuck 100 comprises base plate 105, a plurality of pins 110-n (n=1 . . . N), and a plurality of piezoelectric elements 120-n (hereinafter also "piezoelements"). Pins 110-n stand vertically on base plate 105 to receive partial forces $F_n$ from backside 152 of wafer 150; and piezoelectric elements 120-n are attached to pins 110-n to sense the partial forces $F_n$ that wafer 150 applies to pins 110-n. Preferably, piezoelements 120-n are located between pins 110 and base plate 105. Preferably, spaces between pins 110-n are evacuated (vacuum) to pull wafer 150 into the direction of base plate 105. For simplicity, defect 155 (cf. FIG. 1) is illustrated to touch pin 110-2 only.

A combination of a pin and a piezoelement is also referred to as "piezopin". In other words, base plate 105 (or "board") has a piezoelectric sensor grid 120-1 to 120-N with pins 110-1 to 110-N. Preferably, base plate 105 and wafer 150 are surrounded by a housing (not in FIG. 1, cf. FIG. 6). Substantially each pin 110-n is connected underneath to piezoelectric element 120-n (sensor/actuator).

Elements 120-n operate as sensors to generate sensor voltages $V_{Sn}$ in response to induced stress, for example pressure exerted from deviations (e.g., defect 155) on the backside of the wafer. In other words, piezoelements 120-n output sensor voltages $V_{Sn}$ that are representations of partial forces $F_n$.

In an ideal case, "ultra-flat wafer" (Z equal), variations of the sensor voltages $V_{Sn}$ would be in a predetermined (threshold) voltage range of about 20 or less per cent of the maximum sensor voltage $V_S$ that can be generated (e.g., $V_{S\,MAX} \approx 20$ millivolt).

Having sensor voltages at about zero ($V_S=0$) for a nominal force $F_{NORM}$ (weight of wafer 150 divided by N) is convenient, but not essential for the present invention. The sensors can also generate a sensor offset voltage $V_{S\,OFFSET}$ that is substantially equal for all elements.

In a non-ideal case, for example, for wafer 150 having defect 155, deviations from the range (voltages outside the range) indicate the backside defect. In the example of FIG. 2, defect 155 causes $F_2$ to be larger than the other forces $F_n$ so that $V_{S2}$ is different from the other voltages $V_{Sn}$.

The plurality of sensor voltages $V_{Sn}$ creates a profile map that indicates the locations (e.g., XY coordinates) of wafer backside defect 155 (cf. FIG. 1, grid lines) ("topography effects").

As it will be explained with more detail later, the present invention allows to compensate for wafer defect 155 by laying wafer 150 on the plurality of pins 110-n of chuck 100, sensing for each pin 110-n a gravitational force (i.e., $F_n$) with elements, and actuating with elements 120-n.

Using chuck 100 of the present invention has a number of advantages over the prior art. For example, focusing in lithography steps can be made more accurate to avoid spots (cf. 158) and other non-flatness effects.

It is a further advantage of the present invention, that warped wafers would also be made flatter by this technique, preventing above mentioned chuck vacuum errors.

Figure 3:
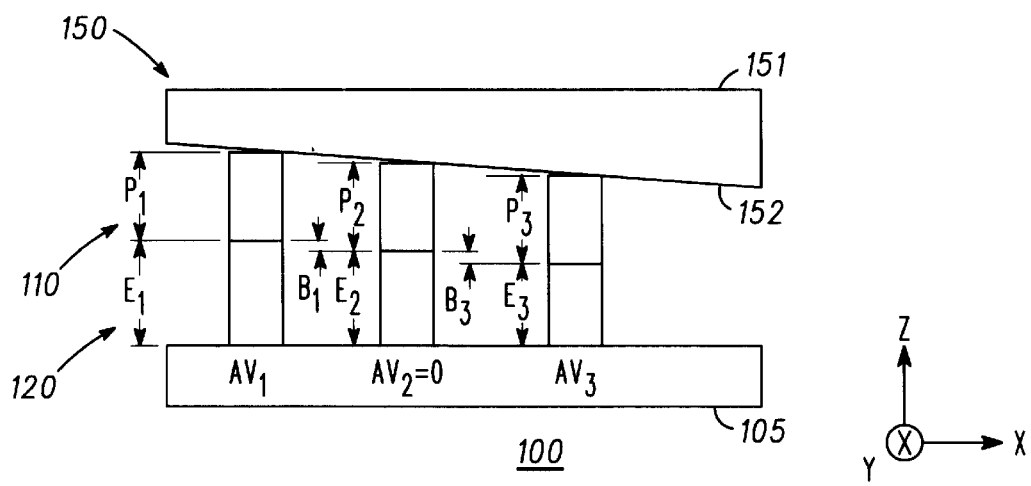
FIG. 3 illustrates a simplified diagram of a pin-piezoelement arrangement in the chuck of FIG. 2.

FIG. 3 illustrates a simplified diagram of a pin-piezoelement arrangement 110/120 in chuck 100 of FIG. 2. For example, FIG. 3 shows, conveniently very much simplified, pins 110-1, 110-2, 110-3, elements 120-1, 120-2, 120-3 and wafer 150 with a defect that lead to backside contour in form of a wedge.

Pins 110-n have substantially equal vertical dimensions $P_n$. For compensation (i.e., of defect 155 or other backside variation), piezoelements 120-n operate as actuators with variable vertical dimensions $E_n$. Both dimensions add to variable height $H_n = P_n + E_n$.

Piezoelements 120-n apply partial displacements $B_n$ ("shift") of pins 110-n to act on selected areas (cf. grid in FIG. 1) of wafer 150 when receiving actuator voltages $V_{An}$. The displacement is conveniently referred to a non-energized piezoelement; in the example to element 120-2 where $V_{A2}=0$ and $B_2=0$.

Pins 110-n are allowed to move up and down, such as with a positive $B_1$ driven by element 120-1, and a negative $B_3$ driven by element 120-3. Frontside 151 becomes substantially coplanar to the XY-plane. The displacement can also be considered as changing the height (e.g., $H_1$, $H_2$, $H_3$) where pins 110-n touch wafer backside 152.

In other words, a first subset of the plurality of piezoelements 120-n applies positive partial displacement towards wafer 150 (e.g., element 120-1, to expand piezopin 1, left side); and a second subset of the plurality of piezoelements 120-n applies negative partial displacement towards base plate 105 (e.g., element 120-3, shrink piezopin 3, right side).

Having defined actuator voltages $V_A$ at zero in case of zero displacement (i.e., $V_A=0$, B=0) is convenient for explanation, but not limited to the present invention. Optionally, actuator voltages $V_A$ of all piezoelements 120-n can be biased by an substantially equal offset voltage $V_{A\,OFFSET}$. Biasing is useful to fine-tune the position of wafer 150 in respect to the Z-axis. Finetuning can further improve the image focusing (cf. beam 190 in FIG. 1).

Non-equal actuator offset voltages $V_{A\,OFFSET}$ that depend on either the X-coordinate (i.e., $V_{A\,OFFSET}=f(X)$) or the Y-coordinate (i.e., $V_{A\,OFFSET}=f(X)$), or that depend on both coordinates, $V_{A\,OFFSET}=f(X,Y)$ ) can equalize any imbalance of chuck 100 from an ideal XY image plane focused by beam 190 (cf. FIG. 1). In other words, actuator offset voltages allow to compensate errors in the suspension of chuck 100 (cf. FIG. 7).

Figure 4:
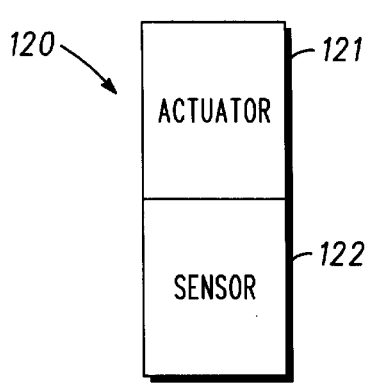
FIG. 4 illustrates a simplified diagram of a piezoelectric element having a sensor part and an actuator part.

FIG. 4 illustrates a simplified diagram of piezoelectric element 120 having sensor part 121 and actuator part 122 separated. This is convenient, but not essential. It is well known in the art that a single piezoelement can operate either as a sensor or as an actuator (inverse nature of piezoelectric effect).

Figure 5:
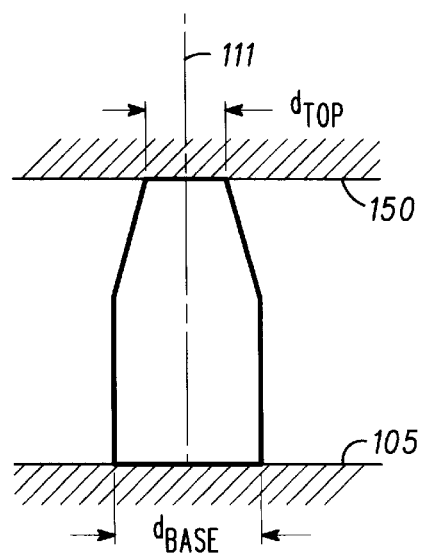
FIG. 5 illustrates a simplified diagram of an optional embodiment of the pin-piezoelement arrangement in the chuck of FIG. 2.

FIG. 5 illustrates a simplified diagram of an optionaly embodiment of pin-piezoelement arrangement 110/120 located between wafer 150 and base plate 105. It is only the intention of FIG. 5 to illustrate that the top and base areas by which piezopin 110/120 touches wafer 150 and base plate 105, respectively, can be different (preferably, base area larger than top area). For simplicity, any distinction between pin 110 and piezoelement 120 is therefore left out. Dot-dash line 111 is a center line.

As illustrated by example, piezopin 110/120 can have the shape of a cylinder (base diameter $d_{BASE}$) that tapers into a truncated cone (top diameter $d_{TOP}$). A useful range for the top diameter $d_{TOP}$ is between 100 and 2000 micrometer, wherein the range between 100 and 200 micrometer is preferred. Pin tapering contributes to a preferred contact area reduction.

Figure 6:
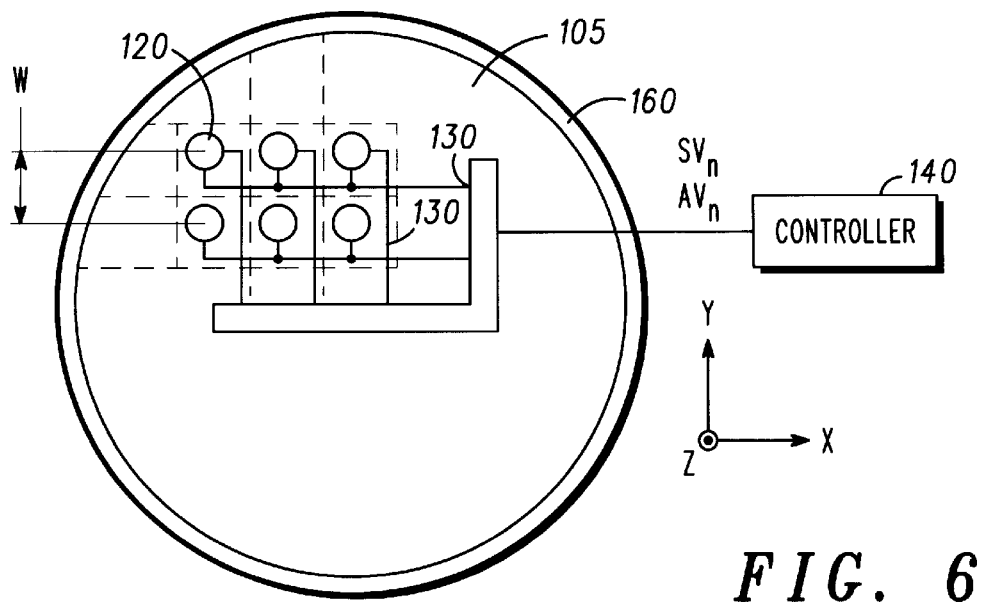
FIG. 6 illustrates a simplified diagram of a base plate of the chuck having circuitry coupled to a controller.

FIG. 6 illustrates a simplified diagram of base plate 105 of chuck 100 with elements 120-n and circuitry 130 coupled to external controller 140. Conveniently, FIG. 6 also illustrates the areas by the dashed grid line introduced in FIG. 1.

Circuitry 130 forwards sensor voltages $V_{Sn}$ to external controller 140 and forwards actuator voltages $V_{An}$ from controller 140. Conveniently, FIG. 6 also illustrates housing 160 to surround plate 105.

Controller 140 can also be a micro-controller-unit (MCU). Circuitry 130 can forward the sensor voltages $V_{Sn}$ and the actuator voltages $V_{An}$ consecutively, that means, first the sensor voltages, and second the actuator voltages.

Circuitry 130 can be implemented such as to forward sensor $V_{Sn}$ and actuator $V_{An}$ voltages substantially simultaneously for all piezoelectric elements 120-n; or to forward sensor $V_{Sn}$ and actuator $V_{An}$ voltages consecutively for rows and columns of piezoelements 120-n.

Preferably, controller 140 controls each piezoelement 120-n independently. In other words, each pin 110-n becomes adjustable to the contour on wafer backside 152 (minimizing backside particle topography) to maintain flatness (Z-coordinate) and vacuum sealing of wafer 150.

In other words, piezoelectric elements 120-n vary the effective area (i.e. top areas) in which pins 110-n touch selected areas of object 150 differently to provide an area specific vacuum force.

It is an advantage of the present invention that the unwanted effects of particle or contamination impacts (cf. defect 155) on the backside are compensated.

Although the example of FIG. 6 illustrates elements 120-n by circles (top view of cylinders as in FIG. 5), those of skill in the art are able to implement elements 120-n and pins 110-n in various other shapes or profiles, such as squares or hexagons. Having illustrated circuitry 130 with electrical conductors at the top of plate 105 between elements 120-n is convenient, but not essential. The conductors can also be located elsewhere, for example, below elements 120-n, i.e. inside base plate 105.

Preferably, for wafer 150 with a diameter D≈300 millimeter, the total number N of pins (110-n) is in the range between N=700 and N=4000. The pin-to-pin distance W ("pin pitch", between center lines 111, cf. FIG. 5) has a useful range between 2.5 and 10 millimeter.

A pin density is defined as the ratio between the total number of pins (i.e. N) and the total wafer area (i.e. $\pi*0.25*D^2$). The distance W results in a pin density in the range between 1 and 4 pins per 100 square millimeter.

The above mentioned contact percentage is defined as the ratio between the total wafer area (i.e. $\pi*0.25*D^2$) and the totality of all top areas (e.g., $N*\pi*0.25*d_{TOP}^2$ for equal $d_{TOP}$). With tapered arrangement 110/120 as illustrated in FIG. 5, chuck 100 offers the advantages of a pin chuck with a lower or equal contact percentage as compared to the prior art. Pins can be adjusted to vary the contact percentage and vacuum clamping to the wafer. This can be used to add or subtract the amount of vacuum (clamping force) to achieve proper flatness.

The number N' of areas affected by defects 155 is not important. The present invention can accommodate both large backside contamination areas such as organics or film irregularities as well as small submicron particles.

Once the compensation has occurred, the current pin location (cf. FIG. 3, adjusted height $H_1$, $H_2$, $H_3$) can be maintained, for example, by (i) continued application of actuator voltage $V_{An}$ to elements 120-n; (ii) exertion of a rotation force to lock-in pins 110-n to plate 105 (e.g., pin design has a cam mechanism to act as a wedge); or (iii) application of an electromagnetic field to lock pins 110-n in-place within plate 105.

Figure 7:
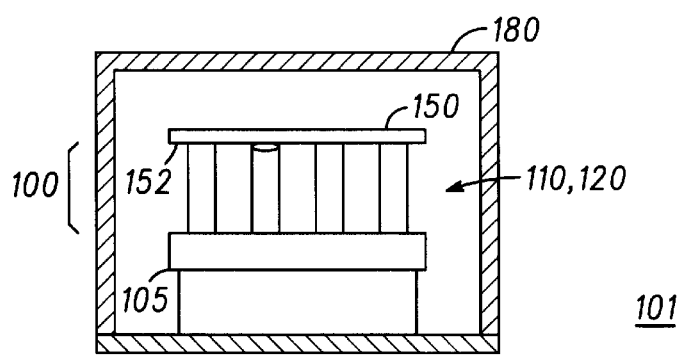
FIG. 7 illustrates a simplified diagram of a wafer processing apparatus with a processing chamber and a vacuum lithography chuck according to the present invention.

FIG. 7 illustrates a simplified diagram of wafer processing apparatus 101 with processing chamber 180 and vacuum lithography chuck 100 according to the present invention. Apparatus 101 comprises base plate 105 suspended in chamber 180, a plurality of pins 110 standing vertically on base plate 105, and a plurality of piezoelectric elements 120 attached to pins 110. As explained in detail above, pins 110 receive partial forces from backside 152 of wafer 150 and provide a contour representation in the form of a sensor voltage vector. Piezoelectric elements 120 sense the different partial forces that result from irregularities (backside contour) and partially (i.e. locally) apply compensating displacements of pins 110 in correspondence to the sensed partial forces when receiving an actuator voltage vector.

Figure 8:
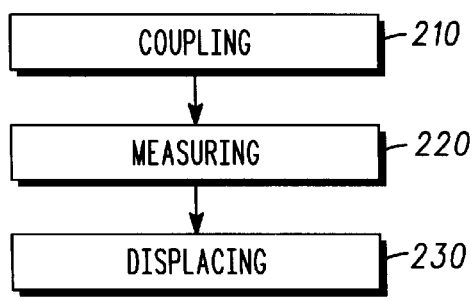
FIG. 8 is a simplified method flow chart diagram of a method according to the present invention.

FIG. 8 is a simplified method flow chart diagram of method 200 according to the present invention. Method 200 for holding a substantially flat object (e.g., wafer 150) having a backside contour such that the frontside (cf. 151) of the object is substantially coplanar to a reference plane (e.g., XY-plane) comprises the steps coupling 210, measuring 220 and displacing 230.

In coupling step 210, the object is coupled (i.e., laid down) to a plurality of pins 110-n arranged substantially perpendicular to the object (cf. FIG. 2). In measuring step 220, piezoelements 120-n attached to the plurality of pins 110-n provide a plurality of sensor voltages $V_{Sn}$ that represent the backside contour. In displacing step 230, some of pins 110-n are displaced (i.e., by $B_n$) when actuator voltages $V_{An}$ are applied to piezoelements 120-n in correspondence to the backside contour. When the object is the above mentioned flatness standard, then the backside contour forms reference plane XY.

Method 200 is especially useful for manufacturing semiconductor devices, where a single chuck has to consecutively hold a plurality of wafers. The time required to perform steps 210, 220 and 230 is sufficiently small to ensure high wafer throughput and short overall processing times.

Lithography tools commonly measure local printing site flatness prior to exposing the wafer, for example by laser interferometry. Such measurements can be used to adjust and/or calibrate the pin and piezoelement arrangement of the invention, thus achieving improved flatness.

The application of a flatness standard instead of the wafer can be used to detect whether cleaning is necessary or whether a damage has occurred to the pin and piezoelement arrangement (self-diagnostic).

A systematic problem in chuck 100 can be detected by continuously monitoring the corrections (e.g., $V_S$, $V_A$) from wafer to wafer that goes through chuck 100.

As a lithography process diagnostic tool, chuck 100 can be used to investigate known and measurable flatness deviations. For example, predetermined patterns can be printed on the wafers to study of ability of chuck 100 to correct defects (and therefore to improve the resultant image quality). These studies would add an extra dimension to focus/exposure data, with wedge or non-flatness effects added in.

While the invention has been described in terms of particular structures, devices and methods, those of skill in the art will understand based on the description herein that it is not limited merely to such examples and that the full scope of the invention is properly determined by the claims that follow.

What is claimed is:

1. Lithography chuck to hold a flat object at the backside, said chuck comprising:
   a base plate;
   a plurality of pins standing vertically on said base plate to receive partial gravitational forces from said backside of said object resting on said pins; and
   a plurality of piezoelectric elements attached to said pins to sense the partial gravitational forces applied from said object to said pins.

2. The chuck of claim 1 wherein said piezoelectric elements are located between said pins and said base plate.

3. The chuck of claim 1 wherein said piezoelectric elements provide representations of said partial forces by sensor voltages.

4. The chuck of claim 1 wherein said piezoelectric elements apply partial displacements of said pins to act on selected areas of said object when receiving actuator voltages.

5. The chuck of claim 4 wherein said piezoelectric elements are biased by a substantially equal offset voltage to fine-tune the position of said object.

6. The chuck of claim 4 wherein a first subset of said plurality of said piezoelectric elements applies positive partial displacements towards said object.

7. The chuck of claim 4 wherein a second subset of said plurality of said piezoelectric elements applies negative partial displacements towards said base plate.

8. The chuck of claim 4 wherein said base plate comprises circuitry to forward said sensor voltages to an external controller and said actuator voltages from said controller.

9. The chuck of claim 8 wherein said circuitry forwards said sensor voltages and said actuator voltages consecutively.

10. The chuck of claim 8 wherein said circuitry forwards said sensor and actuator voltages substantially simultaneously for all piezoelectric elements.

11. The chuck of claim 8 wherein said circuitry forwards said sensor and actuator voltages consecutively for rows and columns of piezoelectric elements.

12. The chuck of claim 8 wherein said controller controls each piezoelectric element independently.

13. The chuck of claim 1 wherein said object is a semiconductor substrate.

14. The chuck of claim 1 wherein the object has a diameter D≈300 millimeter and the number of pins is in the range between 700 and 4000.

15. The chuck of claim 1 wherein a pin-to-pin distance is between 2.5 and 10 millimeter.

16. The chuck of claim 1 wherein a pin density is between 1 and 4 pins per 100 square millimeter.

17. The chuck of claim 4 wherein each of said piezoelectric elements comprises a sensor part and an actuator part.

18. The chuck of claim 1 wherein spaces between said pins are evacuated to pull said object into the direction of said base plate.

19. The chuck of claim 18 wherein said piezoelectric elements vary the effective area in which said pins touch selected areas of said object to provide an area specific vacuum force.

20. Method for holding a substantially flat object having a backside contour such that the frontside of said object is substantially coplanar to a reference plane, said method comprising the following steps:

resting said object on a plurality of pins being arranged substantially perpendicular to said object;

measuring by piezoelements attached to said plurality of pins a plurality of sensor voltages that represent said backside contour; and displacing some of said pins corresponding to said backside contour by applying actuator voltages to said piezoelements.

21. Method of claim 20 wherein said object is a semiconductor wafer.

22. The method of claim 20 wherein said object is a surface flatness standard.

23. Wafer processing apparatus with a processing chamber and a vacuum lithography chuck to hold a wafer at the backside, wherein said chuck of said wafer processing apparatus comprises:

a base plate;

a plurality of pins standing vertically on said base plate to receive partial gravitational forces from said backside of said wafer resting on said pins; and a plurality of piezoelectric elements attached to said pins to sense different partial forces resulting from irregularities of said backside and to partially apply compensating displacements of said pins in response to said sensed partial forces.

* * * * *